US007339508B2

(12) United States Patent
Cosgrave et al.

(10) Patent No.: US 7,339,508 B2
(45) Date of Patent: Mar. 4, 2008

(54) DIGITAL TO ANALOG CONVERTER WITH SHARED CALIBRATION

(75) Inventors: Gavin Cosgrave, Enniscorthy (IE); Colin Gerard Lyden, Baltimore (IE); Roderick C. McLachlan, Edinburgh (GB); Dennis A. Dempsey, Crecora (IE); Tudor M. Vinereanu, Frenches Quay (IE); Patrick Kirby, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/474,174

(22) Filed: Jun. 23, 2006

(65) Prior Publication Data

US 2007/0296618 A1 Dec. 27, 2007

(51) Int. Cl.
*H03M 1/06* (2006.01)

(52) U.S. Cl. ........................................ 341/118

(58) Field of Classification Search ................ 341/118, 341/120, 139, 143, 144, 145

See application file for complete search history.

(56) References Cited

U.S. PATENT DOCUMENTS

| | | | | |
|---|---|---|---|---|
| 4,677,581 | A * | 6/1987 | Malka et al. | 702/90 |
| 6,052,074 | A * | 4/2000 | Iida | 341/135 |
| 6,531,975 | B1 * | 3/2003 | Trotter et al. | 341/144 |
| 6,809,673 | B2 * | 10/2004 | Scanlan et al. | 341/144 |
| 6,924,759 | B2 * | 8/2005 | Wynne et al. | 341/144 |
| 6,985,100 | B2 * | 1/2006 | Geraghty et al. | 341/141 |
| 7,015,847 | B1 | 3/2006 | McLachlan et al. | |
| 2004/0113177 | A1 | 6/2004 | Wynne et al. | |
| 2006/0125669 | A1 | 6/2006 | Dempsey et al. | |

OTHER PUBLICATIONS

Pelgrom et al (M. J. M. Pelgrom, A. C. J. Duinmaijer, and A. P. G. Welbers), "Matching properties of MOS transistors", IEEE J. Solid-State Circuits, vol. 24, Oct. 1989, pp. 1433-1440.

PCT/EP2007/056270 - International Search Report, Sep. 19, 2007.

* cited by examiner

*Primary Examiner*—Brian Young

(74) *Attorney, Agent, or Firm*—Wolf, Greenfield & Sacks, P.C.

(57) ABSTRACT

The invention provides a multi-channel DAC circuit which provides for correlation between selected ones of the multiple channels such that a single set of calibration coefficients may be used for calibration of multiple channels.

33 Claims, 2 Drawing Sheets

DIGITAL TO ANALOG CONVERTER WITH SHARED CALIBRATION

FIELD OF THE INVENTION

The present invention relates to a digital to analog converter (DAC), more particularly to a multi-stage DAC which uses shared correction coefficients for calibration of a first stage of the multi-stages.

BACKGROUND

Digital to analog converters or DACs are well known in the art for providing an interface between the digital and the analog realm. The DAC functions by converting a digital, usually binary, input code to a corresponding analog signal, typically voltage or current. They may be implemented in a variety of fashions such as for example using simple switches or a network of resistors, capacitors or current sources.

In a segmented DAC architecture, the output of a first stage of the DAC architecture is used to provide the input for the second stage. The first stage provides first and second outputs and the second stage interpolates between those first and second outputs to provide an overall output for the DAC. Such circuits are well known in the art.

A modification to such traditional DAC architectures is disclosed in U.S. Pat. No. 7,015,847, co assigned to the assignee of the present invention and the content of which is incorporated herein by way of reference. This patent discloses how a first stage may be shared by multiple second stages. By using multiple second stages a multi-channel DAC may be provided.

With such multi-channel DAC arrangements it is possible for one or more of the DAC channels to be operated in parallel with others of the DAC channels, with the result that multiple outputs from the DAC are simultaneously possible. This is advantageous for a number of applications. However, if DC accuracy performance is required to be better than initial matching of the fabrication process requires then some calibration will be required to ensure that accurate conversion with the requisite levels is achieved.

There is further requirement with calibration that it be fast and cheap, in order to minimize delays in the DAC update during operation of the DAC. There is also always pressure on the designer of integrated circuits to minimize the area of silicon required for implementation of the circuit, and therefore if calibration is to be provided for the DAC it is preferable that the implementation of the calibration be provided in a manner that does not occupy too much space on the silicon.

There is therefore a need to provide a calibration technique for such multi-channel DACs which can be easily implemented.

SUMMARY

These and other problems are addressed by a DAC circuit in accordance with the teaching of the present invention which provides for a sharing of calibration coefficients across multiple channels of a multi-channel DAC arrangement. In this way the data storage requirements that are required for storage of such calibration coefficients required for each of the DAC channels is reduced.

A first embodiment in accordance with the teaching of the invention provides a multi-channel DAC circuit including a main DAC providing multiple outputs to each of multiple sub-DACs so as to form a multi-channel DAC with outputs of each of the channels being correlated with outputs of other channels, and wherein a calibration of the DAC circuit for a first channel effects a corresponding calibration of the DAC circuit for a second channel.

These and other features will be apparent from the following drawings which provide an illustration of the teaching of the invention with reference to exemplary embodiments.

BRIEF DESCRIPTION OF THE DRAWINGS

The present invention will now be described with reference to the accompanying drawings in which.

DETAILED DESCRIPTION OF THE DRAWINGS

Figure 1:
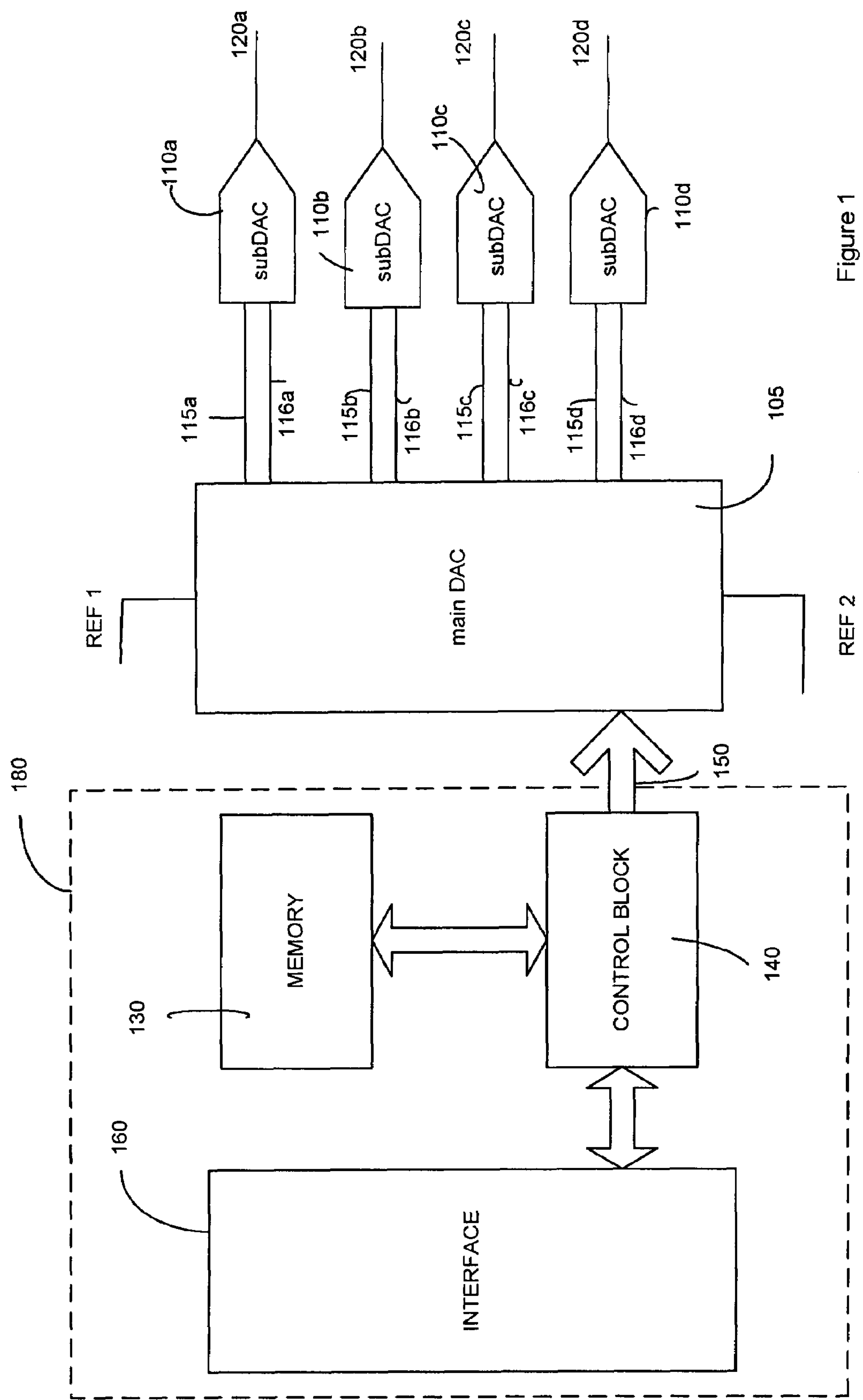
FIG. 1 is a schematic showing in block format a circuit arrangement in accordance with the teaching of the invention.

As shown in FIG. 1, a circuit in accordance with the teaching of the invention provides a multi-channel DAC circuit 100 comprising a main DAC 105 coupled to multiple sub DACs 110*a*, 110*b*, 110*c*, 110*d*. Each of the sub DACs are arranged to interpolate between two signals 115, 116 that are output from the main DAC, so as to provide an output 120 for that channel. Such operation of DAC will be well known to the person skilled in the art. By providing multiple channels in the form of multiple sub DACs, multiple DAC channels may be provided.

As mentioned before in the Background Art section, an example of such multi-channel DAC arrangements is provided in U.S. Pat. No. 7015847, US'847. In US'847 the first stage outputs are derived from a single set of elements. The arrangement of US'847 shows this set as being a set of resistors but the person skilled in the art will realise that equivalently capacitors or other devices such as MOS or bipolar transistors could be used for different application. The present inventors have realised that as there is a degree of commonality or sharing of the first stage, such that any DC error components that are generated by this shared set of components is reflected across all channels that share the same components. The net result is that the error sources that contribute to DC accuracy of the circuit may be considered common to all the DACs. The present inventors have used this realisation that where there is a degree of commonality in circuitry that the calibration of such circuitry may be effected using a shared set of calibration coefficients. Examples of such DC errors in a DAC transfer function include those relating to linearity, gain and offset, with the purpose of the calibration being to bring the performance of the DAC transfer function back to that of an ideal DAC, within the performance parameters required for that particular DAC.

It will be appreciated that the arrangement of the invention utilises and takes advantage of a sharing of the main DAC by each of the sub DACs. In this way a single set of elements which provide for the operation of the main DAC are used as a first stage of multiple channels of a multi-channel DAC. All of the first stage outputs 115, 116 are therefore derived from the same set of elements and so it will be understood that the error sources that affect DC accuracy of the circuit and which may for example contribute to integral non-linearity (INL) are common to all the DACs.

A preferred implementation of the set of elements is as a resistor string arrangement which is, as will be appreciated by those skilled in the art, widely used for level setting applications. The accuracy levels required in most applications require correction of DC error. In previous solutions, each DAC needed it's own set of correction coefficients, as the error sources contributing to the DC error of each channel were different.

The invention provides for a correction of these error sources using a single set of calibration or correction coefficients so as to provide for an improvement of the DC accuracy of the overall multi-channel circuit.

Using an architecture such as that described provides for a shared resistor string across many channels (group). This means that the error sources contributing to DC accuracy on each of the DACs within the group are similar. Since the error sources are similar, only one set of calibration coefficients per group needs to be saved, which dramatically reduces the silicon area required for data storage. Therefore this architecture minimises calibration requirements overall for the circuit.

As shown in FIG. 1, an exemplary manner in which the correction may be effected is by providing a digital memory 130 configured to store calibration/correction coefficients. The memory 130 is coupled to a digital control block 140, such that a control word 150 being provided as the input to the DAC is modifiable using a correction algorithm. The correction algorithm will typically use correction coefficients for each of the level-setting elements in the first stage (the main DAC) of the DAC circuit. Such digital correction and the ways in which is may be implemented are apparent to the person skilled in the art, and may for example use suitable hardware for example state machines, multipliers and the like or could for example be implemented in software.

An interface 160 is also coupled to the digital logic block and provides the way in which the input digital word is created for subsequent conversion to the analog equivalent by the DAC. The interface could be a user interface whereby a user could specifically access the DAC architecture and effect conversion of a desired word, or could for example be simply an interface to another circuit. It will be understood that not all components of the circuit need to provided on the same chip. For example the interface, digital memory and digital control block, collectively shown within the dashed line 180, may be provided on a second chip and then simply interfaced with the DAC components of the first and second stages. For example the components 180 may be provided on a field programmable gate array, FPGA, or some other programmable logic device.

Figure 2:
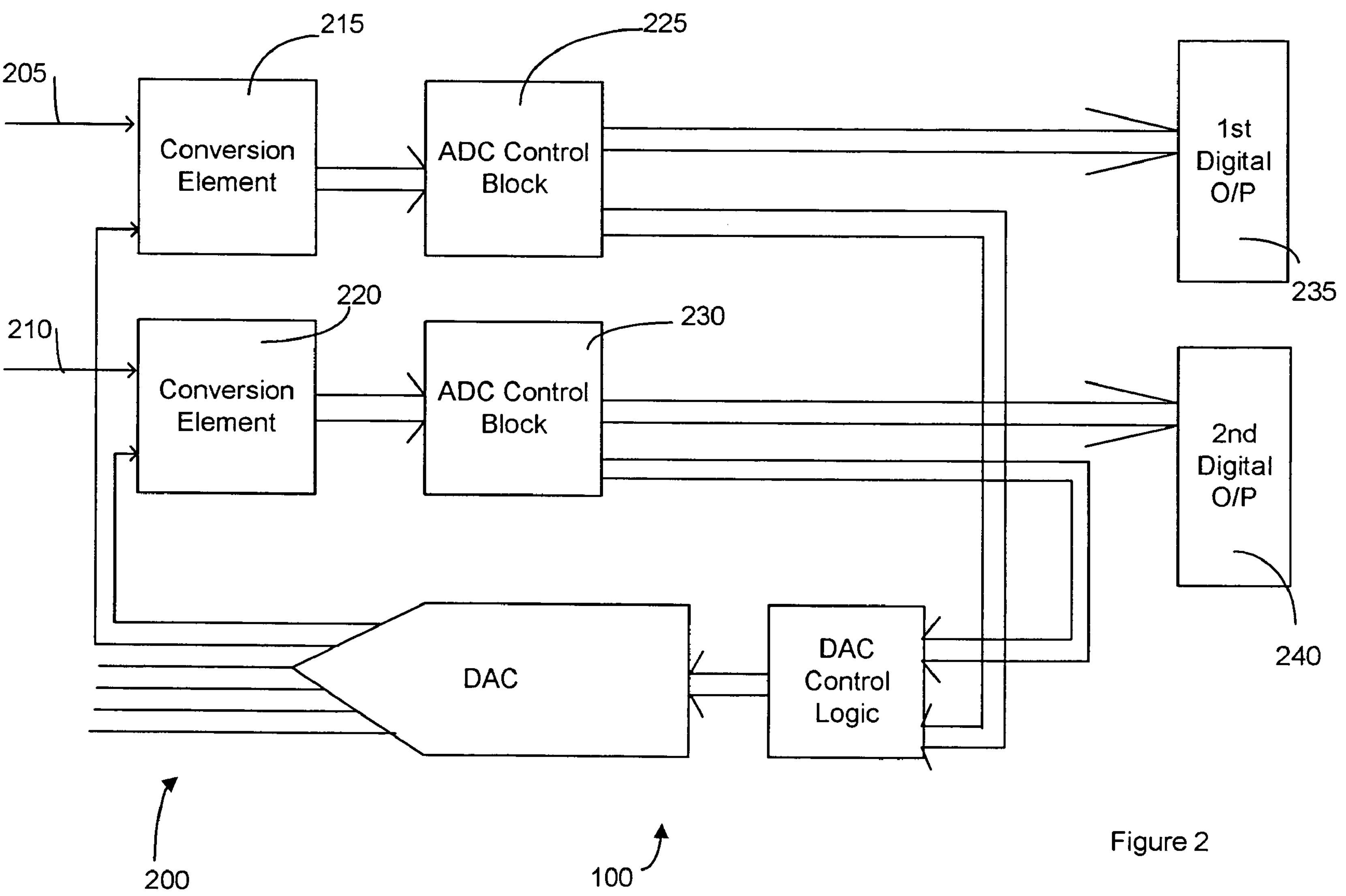
FIG. 2 shows an example of how a DAC circuit in accordance with the teaching of the invention may be provided as part of an ADC.

An example of how the DAC circuitry of the present invention could be used in combination with another circuit is shown in FIG. 2, where the DAC components 100 are provided within an Analog-to-digital, ADC, circuit 200. In this exemplary embodiment of an implementation of a two channel ADC, first 205 and second 210 analog inputs are each provided to a respective conversion element 215, 220. The conversion elements provide inputs to an ADC control block 225, 230 where appropriate digital selection is effected. A portion of the output of each of these control blocks provides the first 235 and second 240 digital outputs of the ADC. A portion of the output is also fed as an input to the DAC according to the teaching of the present invention, which is provided in a feedback configuration.

It will be understood that as every input word or control code to the DAC is corrected based on the correction required for the first stage of the DAC, and as components of that first stage are shared across channels of the DAC that calibration for the multi-channels is achieved on the basis of a reduced set of components than would otherwise be required—if for example each of the channels were not correlated. Many DAC channels can benefit from the improved DC accuracy even though only one set of coefficients is used. A solution in accordance with the teaching of the invention therefore provides a way in which calibration may be achieved without occupying too much area on the chip for the normally required plurality of calibration coefficient sets. Furthermore as the calibration is achieved prior to the decision on which channel is being used, designers of DAC circuits can take advantage of this to provide channel independent solutions which can be effected with reduced digital circuitry so as to provide lower cost solutions which may be implemented at higher speeds than heretofore possible. The provision of a digital circuit design that has reduced complexity and incorporates the digital calibration of the present invention will be appreciated by those skilled in the art as having many applications.

It will be understood that a sharing of components across multiple channels of the DAC, and the calibration of those shared components provides particular advantage and accuracy where those components are the dominant sources of error in the circuit. To obtain maximum benefit from the sharing of the DAC calibration coefficients, the DAC should be designed such that the dominant DC error sources are the shared elements. This can be done by reducing the error sources (such as non-linearity) of each of the subDACs by design. This can be done for example using design and layout techniques well known to those skilled in the art of digital to analog converter design and implementation, some of which are for example documented in Pelgrom et al (M. J. M. Pelgrom, A. C. J. Duinmaijer, and A. P. G. Welbers, *Matching properties of MOS transistors, IEEE J. Solid-State Circuits*, vol. 24, pp. 1433 1440, May 1989), the contents of which are incorporated herein by way of reference. Where the dominant DC error sources in the entire DAC are the shared elements, the overall DAC DC errors can be substantially removed using the shared calibration.

Preferred embodiments of circuits in accordance with the teaching of the invention have been described with reference to a multi-channel DAC circuit which provides for correlation between selected ones of the multiple channels such that a single set of calibration coefficients may be used for calibration of multiple channels. While it is desirable that all channels of the multiple available channels may share the same coefficients it will be appreciated that certain applications or design considerations may require selected ones of the channels not to be correlated with others of the channels and as such may not share coefficients with those of other channels.

While the invention has been described with reference to a preferred embodiment thereof it will be understood and appreciated that many modifications may be made without departing from the spirit and scope of the invention. It is intended that the invention should also be considered limited as shall be deemed necessary in the light of the appended claims. Furthermore, while the operation of the invention has been described with reference to exemplary block boundaries defining the operation of specific components or integers of circuits in accordance with the teachings of the invention, those skilled in the art will appreciate that digital design circuitry can be un-grouped and synthesized as desired, which can remove the block boundaries as shown here for the purposes of explanation.

The words comprises/comprising when used in this specification are to specify the presence of stated features, integers, steps or components but does not preclude the presence or addition of one or more other features, integers , steps, components or groups thereof.

The invention claimed is:

1. A multi-channel DAC circuit including a first DAC stage coupled to multiple second stages so as to define multiple DAC channels, each of the DAC channels having a DC transfer function and the outputs of each of the second stages defining individual DAC channel outputs, and wherein the circuit employs a shared set of calibration coefficients to enable a correction of the DC transfer function of at least first and second channels of the multiple DAC channels.

2. The circuit as claimed in claim 1 wherein the circuit includes a set of shared components, the shared elements being contributing elements to defining the DC transfer function of selected ones of the multiple DAC channels, and wherein the shared set of calibration coefficients are provided to enable a correction of the DC transfer function of this set of shared components.

3. The circuit as claimed in claim 2 wherein the set of shared components provide inputs for the second stages defining part of the selected ones of the multiple DAC channels.

4. The circuit as claimed in claim 3 wherein the set of shared components are provided as part of the first stage.

5. The circuit as claimed in claim 2 wherein the set of shared components are provided within the first stage of the circuit and provide outputs to selected ones of the multiple second stages.

6. The circuit as claimed in claim 2 wherein the set of shared components are the dominant source of DC errors within the circuit.

7. The circuit as claimed in claim 1 further including calibration means, the calibration means being configured to apply the shared set of calibration coefficients to enable a correction of the DC transfer function.

8. The circuit as claimed in claim 7 wherein the calibration means is configured to apply the shared set of calibration coefficients prior to selection of individual channels of the multiple available channels.

9. The circuit as claimed in claim 7 wherein the calibration means is configured to apply the shared set of calibration coefficients subsequent to selection of individual channels of the multiple available channels.

10. The circuit as claimed in claim 1 wherein the first stage includes a plurality of level setting elements.

11. The circuit as claimed in claim 10 wherein shared set of calibration coefficients include calibration coefficients for each of the level setting elements.

12. The circuit as claimed in claim 1 wherein an input word to the first stage is provided by a digital control block that interfaces between a primary input and the first stage, the digital control block being coupled to a digital memory configured to store the shared set of calibration coefficients, such that each input word provided to the first stage is modifiable by coefficients provided within the calibration registry prior to entry to the first stage.

13. The circuit as claimed in claim 12 wherein the digital control block includes processing elements configured to effect a processing of at least one calibration algorithm, the calibration algorithm being embedded in hardware or software, and being provided to effect a correction of the input word based on the coefficients stored within the digital memory.

14. The circuit as claimed in claim 13 wherein the processing elements of the digital control block are provided off chip.

15. The circuit as claimed in claim 13 wherein all components of the digital control block are provided off-chip.

16. The circuit as claimed in claim 13 wherein the digital control block, primary input and digital memory are provided on a different chip to the first and second stages of the DAC.

17. The circuit as claimed in claim 1 wherein the shared set of calibration coefficients are provided to enable a correction of the DC transfer function of all of the multiple DAC channels.

18. The circuit as claimed in claim 1 wherein all of the channels are correlated with others of the channels.

19. The circuit as claimed in claim 1 wherein some of the channels are correlated with others of the channels.

20. The circuit as claimed in claim 1 wherein each of the plurality of first stage outputs are derived from a single set of elements such that DC error sources are common to each of the channels of the multi-channel DAC.

21. The circuit as claimed in claim 2 wherein the shared set of components is the dominant source of DC error within the circuit.

22. The circuit as claimed in claim 2 wherein the shared set of components is provided as a set of resistors.

23. The circuit as claimed in claim 1 wherein the shared set of calibration coefficients are stored in a memory.

24. The circuit as claimed in claim 23 wherein the memory is provided on a different chip to the DAC.

25. The circuit as claimed in claim 23 wherein the shared set of calibration coefficients are provided in software.

26. An analog to digital converter, ADC, including a DAC circuit, the DAC circuit being a multi-channel DAC circuit including a first DAC stage coupled to multiple second stages so as to define multiple DAC channels, the first stage having a set of components shared with selected ones of the multiple second stages and providing a first stage output for each of the second stages to which it is coupled, each of the second stages providing an output for that DAC channel, and wherein the circuit is configured such that calibration coefficients for each of the channels sharing the set of components are shared across all of the channels sharing the set of components, and wherein the DAC circuit is provided in a feedback configuration within the ADC arrangement.

27. A multi-channel DAC circuit having correlation between selected ones of the multiple channels, the circuit including a single set of calibration coefficients used for calibration of multiple channels.

28. The DAC circuit as claimed in claim 27 wherein the DAC includes a first stage and multiple second stages.

29. The DAC circuit as claimed in claim 27 wherein correlation is provided by sharing components of the first stage with a plurality of second stages.

30. A method of calibrating a multi-channel DAC circuit, the method including:

a. Providing a first DAC stage coupled to multiple second stages so as to define multiple DAC channels, each of the DAC channels having a DC transfer function and the outputs of each of the second stages defining individual DAC channel outputs, and b. Using a shared set of calibration coefficients to enable a correction of the DC transfer function of at least first and second channels of the multiple DAC channels.

31. The method of claim 30 wherein the shared set of calibration coefficients are operable on a shared set of components, the shared set of components being provided as part of the first stage and being shared by the at least first and second channels.

32. The method of claim 30 wherein the step of using the shared set of calibration coefficients includes retrieving the shared set of calibration coefficients from a memory.

33. The method of claim 32 wherein the retrieval effects a retrieval from a memory remote from the DAC circuit.

* * * * *